United States Patent
Taniguchi et al.

(10) Patent No.: US 7,235,784 B2
(45) Date of Patent: Jun. 26, 2007

(54) TRANSMISSION ELECTRON MICROSCOPE AND IMAGE OBSERVATION METHOD USING IT

(75) Inventors: Yoshifumi Taniguchi, Hitachinaka (JP); Hisafumi Otsuka, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/245,428

(22) Filed: Oct. 7, 2005

(65) Prior Publication Data

US 2006/0076492 A1   Apr. 13, 2006

(30) Foreign Application Priority Data

Oct. 12, 2004   (JP) ............................. 2004-297958

(51) Int. Cl.
- *G21K 7/00* (2006.01)
- *G01N 23/00* (2006.01)
- *H01J 37/28* (2006.01)

(52) U.S. Cl. .................. 250/311; 250/310; 250/306; 250/309; 250/392; 250/396 R; 250/397; 250/398; 250/440.11; 250/442.11

(58) Field of Classification Search ............... 250/310, 250/311
See application file for complete search history.

(56) References Cited

U.S. PATENT DOCUMENTS

| | | | |
|---|---|---|---|
| 4,031,391 A | | 6/1977 | Hoppe |
| 6,750,451 B2 * | | 6/2004 | Koguchi et al. ............. 250/311 |
| 6,777,679 B2 * | | 8/2004 | Nagaoki et al. ............. 250/311 |
| 6,841,775 B2 * | | 1/2005 | Kondo et al. ................ 250/306 |
| 6,933,499 B2 * | | 8/2005 | Furukawa et al. ........... 250/310 |
| 2003/0006373 A1 * | | 1/2003 | Koguchi et al. ............. 250/311 |
| 2003/0183762 A1 * | | 10/2003 | Nagaoki et al. ............. 250/307 |
| 2004/0031921 A1 * | | 2/2004 | Kondo et al. ................ 250/311 |
| 2004/0108459 A1 * | | 6/2004 | Furukawa et al. ........... 250/311 |
| 2005/0230636 A1 * | | 10/2005 | Tanaka et al. .......... 250/440.11 |
| 2006/0076492 A1 * | | 4/2006 | Taniguchi et al. ........... 250/311 |

FOREIGN PATENT DOCUMENTS

| | | |
|---|---|---|
| DE | 25 29 735 | 1/1997 |
| JP | 2-585833 | 12/1991 |
| JP | 3-314422 | 3/1994 |
| JP | 7-272665 | 10/1995 |
| JP | 10-172492 | 6/1998 |
| JP | 2000294185 A | 10/2000 |
| JP | 2001-118535 A | 4/2001 |
| JP | 2004031126 A | 1/2004 |
| JP | 2004-055300 A | 2/2004 |

OTHER PUBLICATIONS

Yoshizo Takai, et al., "Spherical-aberration-free observation of profile images of the Au(011) surface by defocus-modulation image processing," Ultramicroscopy, 1994, pp. 250-260, vol. 54, Elsevier Science B.V.

German Office Action Issued in corrresponding foreign application No. 102005048677.0-54, dated Dec. 8, 2006.

* cited by examiner

*Primary Examiner*—Nikita Wells
*Assistant Examiner*—Bernard Souw
(74) *Attorney, Agent, or Firm*—McDermott Will & Emery LLP

(57) ABSTRACT

Drift generated at the time of photographing a TEM image is corrected simultaneously with photographing, so that a TEM image free form influence of drift is photographed. While the TEM image is recorded, drift in the place out of the view field subjected to recording is measured from moment to moment by another TV camera or a position sensitive detector. Drift is corrected by the movement of the specimen due to a specimen holder or by the movement of the image due to an image shift coil.

10 Claims, 4 Drawing Sheets

TRANSMISSION ELECTRON MICROSCOPE AND IMAGE OBSERVATION METHOD USING IT

BACKGROUND OF THE INVENTION

The present invention relates to a transmission electron microscope and an image observation method using it and particularly relates to a transmission electron microscope capable of observation of an image not affected by drift and an image observation method using the transmission electron microscope.

A transmission electron microscope (TEM) is an apparatus using electron beams for directly observing a fine structure of a specimen and has far higher resolving power than that of an optical microscope so that the TEM can perform atomic-level structure analysis. The TEM is an apparatus indispensable nowadays for the medical and biological field and the metallic and semiconductor material field. Because a technique for observing a specimen while heating/cooling it has been developed, the TEM has been highly recognized to be not only an observation apparatus but also an on-site experimental apparatus.

To perform atomic-level structure analysis, an image is recorded with such magnifying power that a structure can be recorded on an atomic level. Image drift is an issue on this occasion. If an image is recorded in the condition that image drift occurs, the image flows in a drift direction to restrict structure analysis remarkably. Particularly when the specimen is observed while heated/cooled, the influence of image drift becomes remarkable.

A chief cause of image drift is thermal, mechanical and electrical stability. A factor of thermal instability is shape distortion due to temperature changes of a mirror body, a specimen holder and a specimen itself. Causes of the temperature change of the mirror body are change in electric current applied to an electron lens, change in temperature of lens-cooling water, change in room temperature, change in air-conditioning wind direction, and so on. Causes of the temperature change of the specimen holder are deformation at the time of observing the specimen while heating/cooling the specimen, and so on. Causes of the temperature change of the specimen itself are deformation, damage, and so on, due to change in density of applied electron beams.

Factors of mechanical instability are relaxation of stress confined in a specimen manipulation mechanism, and mechanical variation. In the former, stress is high just after movement of the specimen but is relaxed slowly. The latter occurs in such a manner that force for suppressing the specimen manipulation mechanism under atmospheric pressure out of a vacuum changes when air pressure around the apparatus varies. In addition, when floor vibration has a frequency (usually about 1–2 Hz) of resonance with the mirror body, the mechanical variation appears as vibration of the image.

A factor of electrical instability is electrical variation. When the intensity of magnetic field around the mirror body changes, electron beams are deflected so that the image moves.

To suppress image drift, a lot of know-how has been accumulated until now. The simplest and effective know-how is to wait for termination of drift. To perform observation/photographing particularly hating image drift, a measure to supply the apparatus with electricity continuously from the previous day to pay attention to thermal and mechanical stability is generally performed. High-precision equipment is often installed so that the temperature change of an air-conditioner or cooling water becomes as small as possible. The wind from the air-conditioner must be provided so as not to be blown against the mirror body directly. A method of reducing heat change due to current change of the electron lens has been disclosed in Japanese Patent No. 2,585,833. This is a method in which the circumference of an excitation coil is evacuated to a vacuum to thereby reduce heat conduction. An example for suppressing thermal deformation of the specimen holder has been disclosed in Japanese Patent No. 3,314,422. This is a method in which parts high and low in thermal expansion coefficient are combined to cancel the expansion and contraction of the specimen holder. Reduction in applied current density or fixation of the applied region is effective in preventing deformation and damage of the specimen itself.

To reduce mechanical variation, there is the case where an antivibration pedestal is set. Antivibration pedestals are classified into active antivibration pedestals and passive antivibration pedestals. The former detects mechanical variation and gives antiphase variation to a rack on which the apparatus is set. The latter shifts a resonance point with the mirror body to make it difficult to transmit floor vibration directly. A method in which the drift amount of a specimen manipulation mechanism due to change in air pressure is measured in advance so that a piezoelectric element incorporated in the specimen manipulation mechanism is used for canceling variation has been disclosed in JP-A-2004-55300. To reduce electrical variation, there is the case where a magnetic field canceller is set. This detects variation in magnetic field and gives antiphase variation to the mechanism.

To shorten the photographing time as extremely as possible is also effective. While the photographing time is suppressed to be short, the density of the electron beam applied onto the specimen is increased or the developing time is elongated instead.

A method of performing photographing while correcting drift has been proposed. In a method disclosed in Japanese Patent No. 3,454,052, because element distribution images are accumulated in a scanning transmission electron microscope (STEM) for a long time, difference between STEM images output at the same time is detected and a primary electron beam is deflected from moment to moment to thereby correct drift. As another method, there has been proposed a method in which drift speed is measured in advance so that a specimen is moved at a constant speed by a piezoelectric element attached to a specimen stage to thereby cancel drift. A method in which an image shift coil is controlled to cancel drift generated at the time of through-focusing has been proposed in Ultramicroscopy, Vol. 54, pp. 250–260 (1994). In this paper, there has been also proposed a method in which a TEM image is recorded in a video recorder in advance so that each frame is converted into a digital image and that drift is corrected as image data. A method in which view field difference between a plurality of TEM images is calculated to thereby correct specimen drift has been described in JP-A 2001-118535. A method in which a TEM image is picked up by a TV camera disposed above a fluorescent screen so that drift is detected and corrected has been described in JP-A-7-272665.

The simplest method is to wait for termination of specimen drift but a long time is taken and it is inconvenient to wait for termination of drift whenever the position of the specimen is changed. If preparation cannot be made from the previous day, a considerably long time is required for termination of drift. The magnetic field canceller, the high-precision air-conditioner and the cooling water equipment are expressive. The manipulation mechanism using the piezoelectric element for correcting change in air pressure cannot be fit to drift caused by other factors. If photographing is performed in a short time and development is performed for a long time, the negative film becomes so "hard" that the image becomes rough. Even in a slow scan CCD (SSCCD), signal-to-noise ratio (S/N) is lowered because of shortage of signal amount. If a high-luminance electron gun is mounted in order to obtain sufficient degree of darkness, there is the possibility that the specimen may be damaged because of high applied electron beam density. Drift correction of the element distribution image obtained in the STEM cannot be applied to the TEM image. The method of correcting drift by the manipulation mechanism using the piezoelectric element is not effective for drift out of uniform rate. The method of correcting drift due to through-focusing by the image shift coil cannot be applied to general drift. The method of photographing the TEM image as a video image cannot be applied to the photographic film as well as much labor is taken for correction. The method of calculating view field difference between the plurality of TEM images and correcting specimen drift cannot correct drift generated while each TEM image is photographed. The method of taking the TEM image in by the TV camera disposed above the fluorescent screen and detecting and correcting drift cannot detect drift because the TEM image does not appear above the fluorescent screen when the TEM image is recorded.

SUMMARY OF THE INVENTION

An object of the invention is to solve the problem in the background art and to correct drift generated at the time of photographing a TEM image simultaneously with photographing to thereby provide a TEM image free from influence of drift.

To achieve the foregoing object, the invention takes the following measures.

(1) Observation and recording of a TEM image are performed simultaneously in different view fields so that the image is recorded while the moving amount of the image in the observation view field is measured from moment to moment. According to this configuration, the image can be recorded while drift is measured from moment to moment and corrected. Accordingly, a TEM image free from influence of drift can be recorded.

(2) A position sensitive detector (PSD) is attached to a TEM. An image is recorded while the moving amount of the image is measured from moment to moment in the other view field from the image recording view field by the PSD. According to this configuration, the image can be recorded while drift is measured from moment to moment and corrected. Accordingly, a TEM image free from influence of drift can be recorded.

(3) Drift is corrected in such a manner that the specimen is moved directly. According to this configuration, the measured drift can be corrected by the movement of the position of the specimen. Accordingly, a TEM image free from influence of drift can be recorded.

(4) Drift is corrected by a deflection coil disposed between the specimen and the TEM image recording means. According to this configuration, the measured drift can be corrected by the electromagnetic movement of the enlarged image of the specimen. Accordingly, a TEM image free from influence of drift can be recorded.

According to the invention, drift generated at the time of photographing a TEM image is corrected simultaneously with photographing, so that a TEM image free from influence of drift can be obtained.

Other objects, features and advantages of the invention will become apparent from the following description of the embodiments of the invention taken in conjunction with the accompanying drawings.

DESCRIPTION OF THE INVENTION

Embodiments of the invention will be described below in detail with reference to the drawings.

Figure 1:
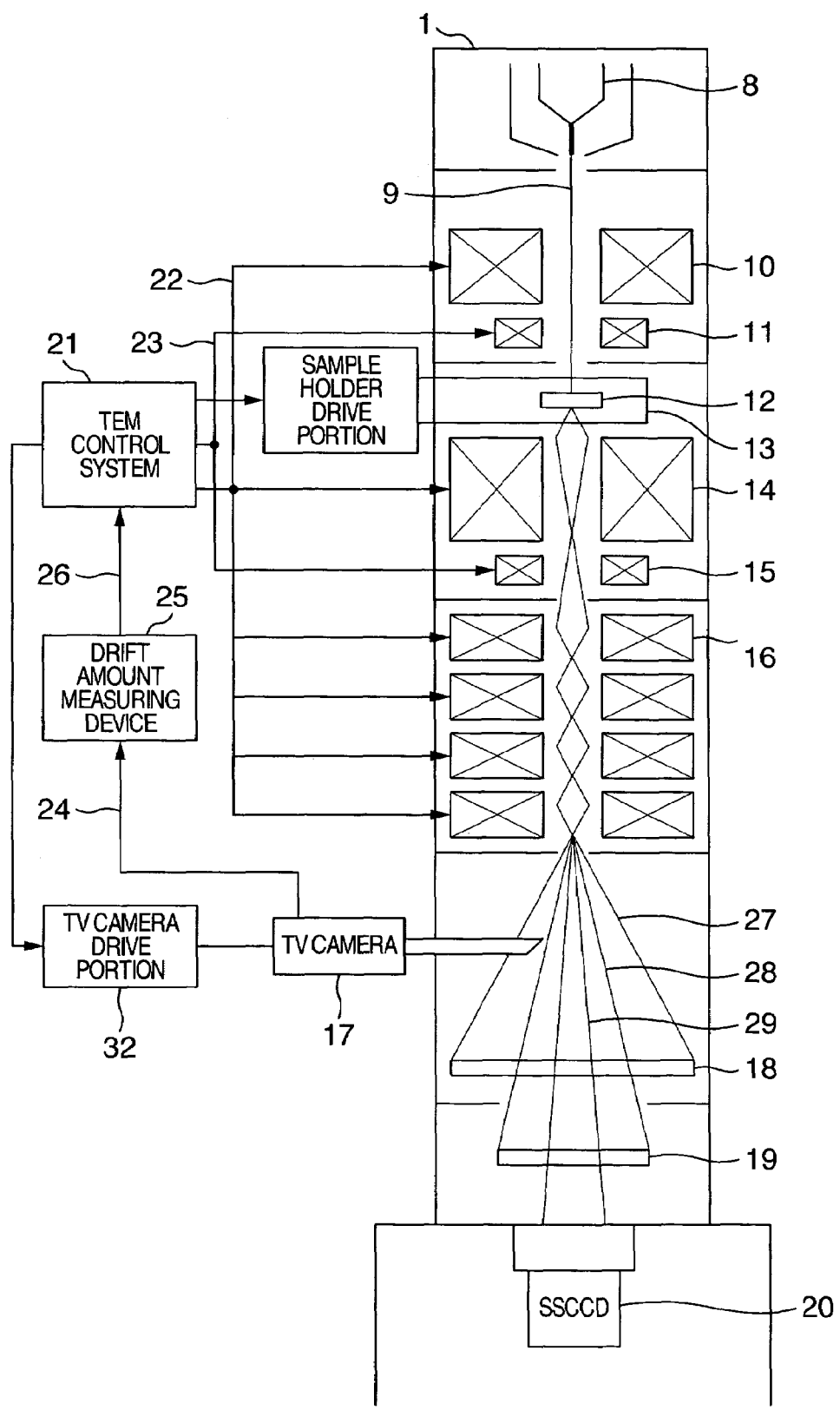
FIG. 1 is a block diagram showing a first embodiment of a transmission electron microscope according to the invention.

FIG. 1 is a block diagram showing a first embodiment of a transmission electron microscope according to the invention. An electron beam 9 generated in an electron gun 8 is applied onto a specimen 12 by a converging lens 10. The position and angle of irradiation can be adjusted by a deflection coil 11. A transmission electron image of the specimen 12 is magnified by an objective lens 14 and intermediate/projection lenses 16, so that the transmission electron image can be observed on an observation fluorescent screen 18. The specimen 12 to be observed is fixed into a specimen holder 13, so that the view field of observation can be adjusted by movement of the specimen holder 13. If an image shift coil 15 is used, the view field of observation can be adjusted electromagnetically without movement of the specimen holder 13. A TEM control system 21 controls all lens systems, electron beam deflection systems and specimen manipulation systems.

The view field 27 of the observation fluorescent screen is provided so that observation can be made in a range as wide as possible. A photographic film 19 or a slow scan CCD (SSCCD) camera 20 is attached to the TEM 1 so that a high-precision TEM image can be recorded. The view field 28 of the photographic film and the view field 29 of the SSCCD are narrower than the view field 27 of the observation fluorescent screen. A TV camera 17 is also attached to the TEM 1 so that a border area in the view field 27 of the observation fluorescent screen except the view field 28 of the photographic film and the view field 29 of the SSCCD can be observed. The TV camera 17 is so movable that the TV camera 17 can be moved in/out with respect to the view field 27 of the observation fluorescent screen or the position of the TV camera 17 can be adjusted by a TV camera drive portion 32.

A video signal 24 picked up by the TV camera 17 is fed to a drift amount measuring device 25. The drift amount measuring device 25 compares the received specimen image with a stored reference image, for example, a specimen image picked up by the TV camera 17 at the time of start of observation, by a suitable method such as image correlation, and measures the direction and magnification of drift on the basis of difference between the two images. The drift amount measuring device 25 feeds the measured drift information as a drift amount signal to the TEM control system 21. The TEM control system 21 performs drift correction by controlling the movement of the specimen holder 13 or controlling the image shift coil 15 so that a TEM image not affected by drift can be recorded by the photographic film 19 or the SSCCD camera 20.

A method using the transmission electron microscope according to the first embodiment for recording a TEM image not affected by drift will be described with reference to FIG. 2 which is a flow chart showing a specific procedure.

First, the view field of observation is searched (S11) so that a specimen is moved into the view field 28 of the photographic film or the view field 29 of the SSCCD. Then, the TV camera 17 is inserted in a region of the view field 27 of the observation fluorescent screen except the view field 28 of the photographic film and the view field 29 of the SSCCD (S12). When the image picked up by the TV camera 17 is out of view field in which drift can be detected, for example, when the image is in the place where the specimen is not provided or in a portion of a mesh frame (S13), the TV camera 17 is moved by the TV camera drive portion 32 (S14) to secure the view field suitable for detecting drift. The term "view field suitable for detecting drift" means a view field in which a peak of brightness appears in its nearly center portion so that the specimen can be observed with good contrast and with less deformation. If the view field suitable for detecting drift cannot be secured, the image observation method with drift correction according to the invention is given up (S15) and ordinary photographing without drift correction is performed instead (S16).

Then, a TV camera image is acquired as a reference for measuring drift (S17) and photographing of a TEM image starts (S18). The sequence of acquisition of the reference image and start of photographing may be reversed. When a sampling time set in advance has then passed (S19), the image of the TV camera 17 is acquired (S20) and fed as a video signal to the drift amount measuring device 25. In the drift amount measuring device 25, the drift amount of the image is measured (S21). A result of the measurement is fed as a drift amount signal 26 to the TEM control system 21. The TEM control system 21 controls the coil current of the image shift coil 15 or controls the specimen holder 13 to correct drift. Specifically, the coil current of the image shift coil 15 necessary for drift correction or the moving amount of the specimen holder 13 is calculated as a correction amount (S22). The correction amount is output to a coil power supply of the image shift coil 15 or to a drive portion of the specimen holder 13 (S23). In the coil power supply of the image shift coil 15 or in the drive portion of the specimen holder 13, designated image shift or specimen holder movement is performed to correct drift.

If control is made so continuously that drift is corrected in a suitable sampling period while the TEM image is recorded by the photographic film 19 or the SSCCD camera 20, the TEM image not affected by drift can be recorded. After completion of the photographing time (S25), correction is canceled (S26) and the drift correction process is terminated.

Figure 3:
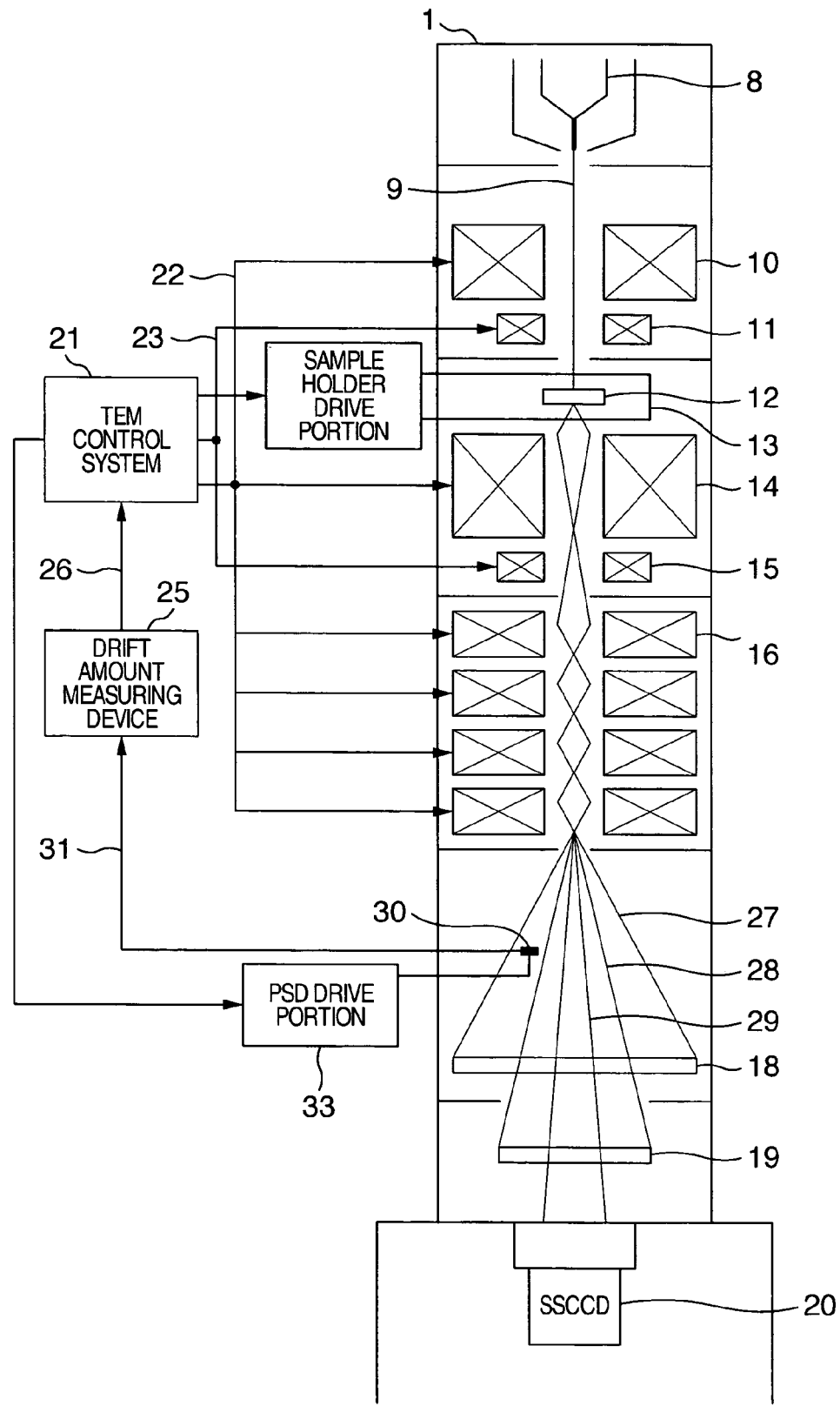
FIG. 3 is a block diagram showing a second embodiment of a transmission electron microscope according to the invention.

FIG. 3 is a block diagram showing a second embodiment of the transmission electron microscope according to the invention. In FIG. 3, portions having the same functions as those in the transmission electron microscope shown in FIG. 1 are referred to by the same numerals for the sake of omission of duplicated description. The difference of this embodiment from the first embodiment shown in FIG. 1 is in that a two-dimensional position sensitive detector (PSD) 30 is attached instead of the TV camera 17, and in that a voltage signal 31 from the PSD 30 is provided instead of the video signal 24 of the TV camera 17 and input into the drift amount measuring device. The PSD 30 is set in a border area of the view field 27 of the observation fluorescent screen except the view field 28 of the photographic film and the view field 29 of the SSCCD. Like the TV camera 17, the PSD 30 is so movable that the PSD 30 can be moved in/out with respect to the view field 27 of the observation fluorescent screen or the position of the PSD 30 can be adjusted by a PSD drive portion 33.

The two-dimensional position sensitive detector outputs coordinate information indicating the gravity center position (x, y) of the luminance distribution of an electron image received in a detection surface, as a voltage signal 31. The drift amount measuring device 25 compares the received coordinates (x, y) with stored reference coordinate information, for example, coordinates $(x_0, y_0)$ of the gravity center position of the luminance distribution acquired by the PDS at the time of start of observation and measures the moving amount $(x-x_0)$ in an X-axis direction and the moving amount $(y-y_0)$ in a Y-axis direction. The drift amount measuring device 25 feeds the measured drift information as a drift amount signal to the TEM control system 21. The TEM control system 21 performs drift correction by controlling the movement of the specimen holder 13 or controlling the image shift coil 15 so that a TEM image not affected by drift can be recorded by the photographic film 19 or the SSCCD camera 20.

A method using the second embodiment for recording a TEM image not affected by drift will be described with reference to FIG. 4 which is a flow chart showing a specific procedure. First, the view field of observation is searched (S31) so that a specimen is moved into the view field 28 of the photographic film or the view field 29 of the SSCCD. Then, the PSD 30 is inserted in a region of the view field 27 of the observation fluorescent screen except the view field 28 of the photographic film and the view field 29 of the SSCCD (S32). When the PSD 30 is located out of view field in which drift can be detected, for example, when the PSD 30 is in the place where the specimen is not provided or in a portion of a mesh frame, the voltage signal from the PSD becomes unstable or comes out of the center of the voltage range. In such a case (S33), the PSD 30 is moved by the PSD drive portion 33 (S34) so that the output voltage comes to the nearly center of the voltage range stably. If the output voltage cannot come to the nearly center, the image observation method with drift correction according to the invention is given up (S35) and ordinary photographing without drift correction is performed instead (S36).

The PSD is more excellent in time response than the TV camera. For example, the time response of the TV camera is 30 frames per second whereas the PSD may have a rise time not longer than 1 μsec. When this characteristic is used, the invention can be applied to image failure caused by faster drift or power supply frequency.

Then, a PSD output voltage is acquired as a reference for measuring drift (S37) and photographing of a TEM image starts (S38). The sequence of acquisition of the reference voltage and start of photographing may be reversed. When a sampling time set in advance has then passed (S39), the voltage of the PSD 30 is acquired (S40) and fed as a video signal to the drift amount measuring device 25. In the drift amount measuring device 25, the drift amount of the image is measured (S41). A result of the measurement is fed as a drift amount signal 26 to the TEM control system 21. The TEM control system 21 controls the coil current of the image shift coil 15 or controls the specimen holder 13 to correct drift. Specifically, the coil current of the image shift coil 15 or the moving amount of the specimen holder 13 necessary for drift correction is calculated as a correction amount (S42). The correction amount is output to the coil power supply of the image shift coil 15 or to the drive portion of the specimen holder 13 (S43). In the coil power supply of the image shift coil 15 or in the drive portion of the specimen holder 13, designated image shift or specimen holder movement is performed to correct drift.

If control is made so continuously that drift is corrected in a suitable sampling period while the TEM image is recorded by the photographic film 19 or the SSCCD camera 20, the TEM image not affected by drift can be recorded. After completion of the photographing time (S45), correction is canceled (S46) and the drift correction process is terminated.

Although the example shown in FIG. 1 or 3 has been described on the case where the TV camera 17 or the PSD 30 is located above the observation fluorescent screen 18, the invention can be used without any problem in the case where the TV camera 17 or the PSD 30 is located below the observation fluorescent screen 18 as long as the aforementioned object can be achieved. When the TV camera 17 or the PSD 30 is located above the observation fluorescent screen 18, magnifying power is lowered because the distance from the intermediate/projection lenses 16 is short. That is, the image becomes so brighter so that drift can be measured in the condition of less influence of noise. Conversely, the amount of current applied to the specimen can be reduced to thereby suppress damage of the specimen. When the TV camera 17 or the PSD 30 is located below the observation fluorescent screen 18, drift can be measured more accurately because magnifying power is high. Both the photographic film 19 and the SSCCD camera 20 need not be attached. To move the specimen directly to correct drift, the specimen holder 13 may be moved directly or the specimen may be moved by a piezoelectric drive device incorporated in the specimen holder 13.

Figure 2:
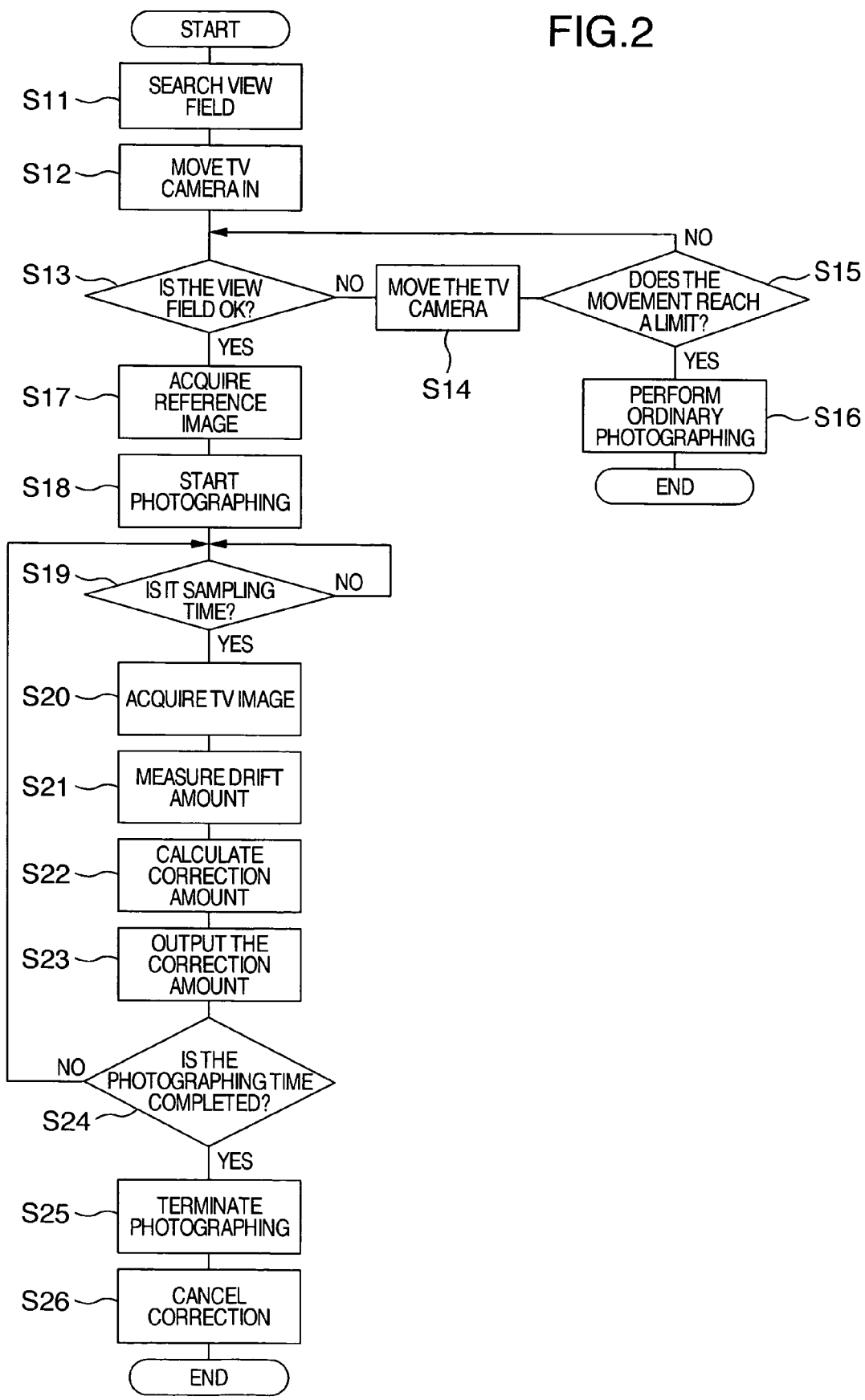
FIG. 2 is a flow chart showing a procedure of recording a TEM image in the first embodiment.
Figure 4:
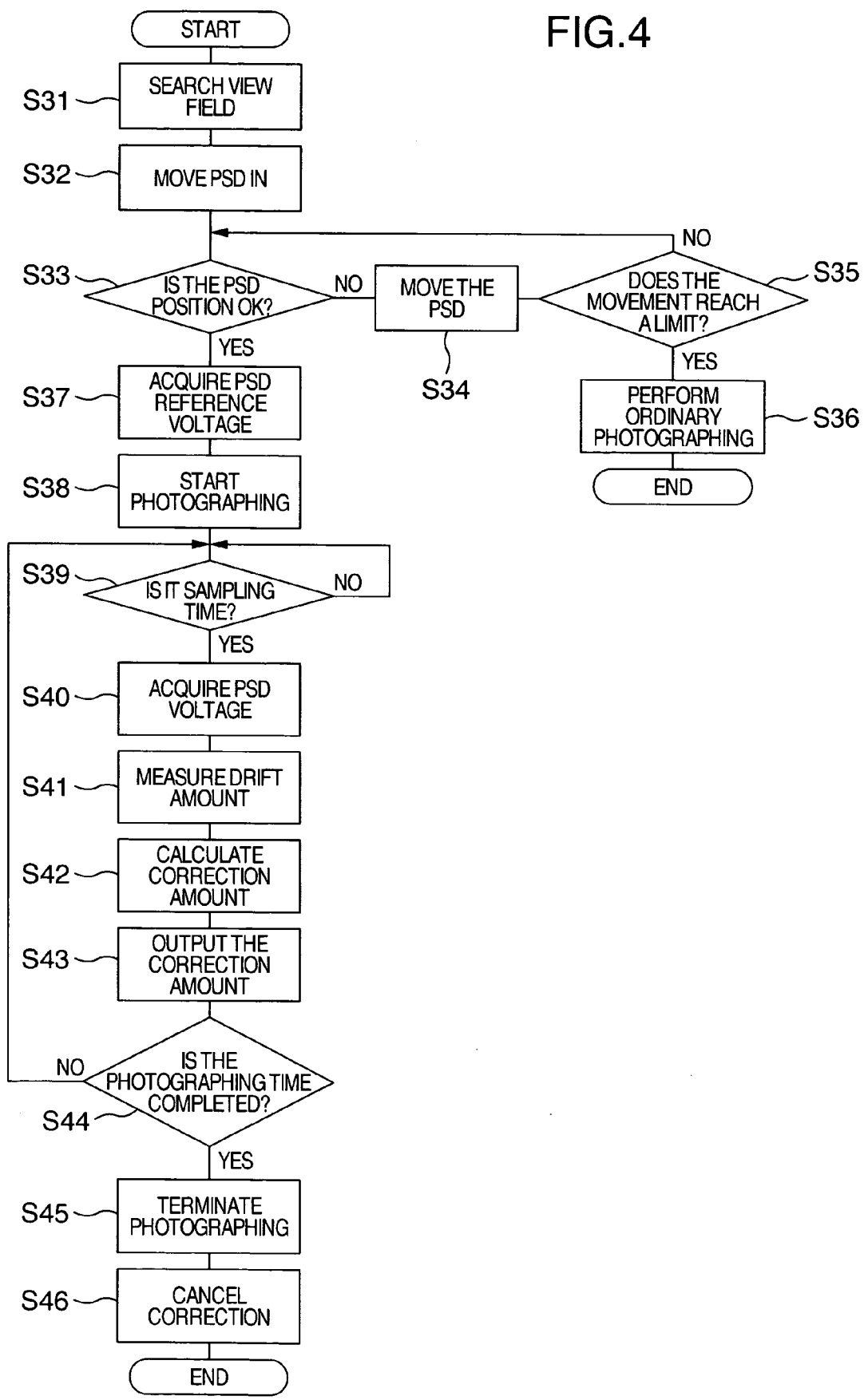
FIG. 4 is a flow chart showing a procedure of recording a TEM image in the second embodiment.

In the flow chart shown in FIG. 2 or 4, a reference image due to the TV camera 17 or a PSD reference voltage due to the PSD 30 is acquired once in the initial stage of photographing., and the reference image or the PSD reference voltage is compared with the video image of the TV camera or the voltage signal of the PSD after the passage of the sampling time. For example, when photographing is performed for a long time or when the specimen deforms slowly, the reference image due to the TV camera 17 or the PSD reference voltage due to the PSD 30 may be however re-acquired at intervals of a predetermined time longer than the sampling time.

Although only one TV camera 17 and only one PSD 30 are shown in FIGS. 1 and 3 respectively, the following merits are generated when a plurality of TV cameras or PSDs are attached or when the two kinds of devices (TV camera and PSD) are attached.
(i) The range of selection of the view field suitable for detecting drift can be widened.
(ii) Information obtained from the TV cameras and/or the PSDs respectively can be averaged to improve accuracy.
(iii) Either of the case where high-precision correction is needed and the case where correction at low applied current is needed can be switched.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A transmission electron microscope comprising:
   an electron gun;
   a specimen holding portion for holding a specimen;
   a converging lens system for applying an electron beam emitted from the electron gun onto the specimen held in the specimen holding portion;
   an imaging optical system for forming an electron beam enlarged image on the basis of the electron beam transmitted through the specimen;
   recording means for recording the electron beam enlarged image;
   observation means for observing a border area of the transmission image enlarged by the electron beam in the outside of a view field of the recording means;
   measuring means for measuring a moving amount of the electron beam enlarged image observed by the observation means; and
   correction means for correcting the moving amount while the electron beam enlarged image is recorded by the recording means.

2. A transmission electron microscope according to claim 1, wherein:
   the observation means is an image pick-up means; and
   the measuring means measures the moving amount of the electron beam enlarged image by comparing an image newly acquired by the image pick-up means with an image picked up and stored by the image pick-up means in advance.

3. A transmission electron microscope according to claim 1, wherein:
   the observation means is a two-dimensional position sensitive detector; and
   the measuring means measures the moving amount of the electron beam enlarged image by comparing a gravity center position of a luminance distribution newly acquired by the two-dimensional position sensitive detector with a gravity center position of a luminance distribution measured and stored by the two-dimensional position sensitive detector in advance.

4. A transmission electron microscope according to claim 1, further comprising specimen moving means for changing the position of the specimen held in the sample holding portion, wherein the correction means corrects the moving amount by driving the specimen moving means to change the position of the specimen.

5. A transmission electron microscope according to claim 1, further comprising electron beam deflecting means disposed between the specimen holding portion and the recording means, wherein the correction means corrects the moving amount by driving the electron beam deflecting means.

6. An image observation method for recording an electron beam enlarged image of a specimen formed by a transmission electron microscope in recording means, comprising the steps of:
   observing a border area of the transmission image enlarged by the electron beam, by observation means disposed out of the view field of the recording means and storing the part of the electron beam enlarged image as reference data;
   observing a part of the electron beam enlarged image by the observation means to acquire observation data while the electron beam enlarged image of the specimen is recorded by the recording means;

measuring an image moving amount of the electron beam enlarged image by comparing the observation data with the reference data; and correcting the image moving amount while the electron beam enlarged image of the specimen is recorded by the recording means.

7. An image observation method according to claim 6, wherein the reference data and the observation data are acquired by an image pick-up means.

8. An image observation method according to claim 6, wherein the reference data and the observation data are acquired by a two-dimensional position sensitive detector.

9. An image observation method according to claim 6, wherein the step of correcting the image moving amount is performed in such a manner that the position of the specimen is moved.

10. An image observation method according to claim 6, wherein the step of correcting the image moving amount is performed in such a manner that the electron beam enlarged image is moved by electron beam deflection means disposed between the specimen and the recording means.

* * * * *